United States Patent [19]

Sauerwald et al.

[11] Patent Number: 4,967,142

[45] Date of Patent: Oct. 30, 1990

[54] ELECTRONIC MODULE COMPRISING A FIRST SUBSTRATE ELEMENT WITH A FUNCTIONAL PART, AND A SECOND SUBSTRATE ELEMENT FOR TESTING AN INTERCONNECTION FUNCTION, SOCKET, SUBSTRATE ELEMENT AND ELECTRONIC APPARATUS THEREFOR

[75] Inventors: Wilhelm A. Sauerwald; Anwar Osseyran; Lars A. R. Eerenstein; Franciscus G. M. De Jong, all of Eindhoven, Netherlands

[73] Assignee: U.S. Philips Corporation, New York, N.Y.

[21] Appl. No.: 342,414

[22] Filed: Apr. 24, 1989

[30] Foreign Application Priority Data

May 27, 1988 [NL] Netherlands ............... 8801362

[51] Int. Cl.[5] .......................................... G01R 31/02
[52] U.S. Cl. .................................. 324/73.1; 371/20.1
[58] Field of Search ............. 324/73 R, 158 R, 738 C, 324/73.1; 371/15, 20, 15.1, 20.1

[56] References Cited

U.S. PATENT DOCUMENTS

| 4,703,483 | 10/1987 | Enomoto et al. | 324/73 R |
| 4,799,004 | 1/1989 | Mori | 324/73 R |
| 4,829,237 | 5/1989 | Segawa et al. | 324/73 R |

Primary Examiner—Reinhard J. Eisenzopf
Assistant Examiner—Edward Urban
Attorney, Agent, or Firm—Jack D. Slobod

[57] ABSTRACT

An electronic, digital IC module includes a substrate element on which is formed a test integrated circuit for the execution of a boundary scan on a standard integrated circuit formed on another substrate element. Either the substrate for the test circuit is provided in an electronic sub-module on which is formed a test socket, in which case the standard circuit is mounted piggyback, or a hybrid package is provided composed of the two substrate elements which are interconnected by bond pads. The test circuit includes a shift register for parallel connection to the standard circuit and serial connection to an external test unit.

10 Claims, 2 Drawing Sheets

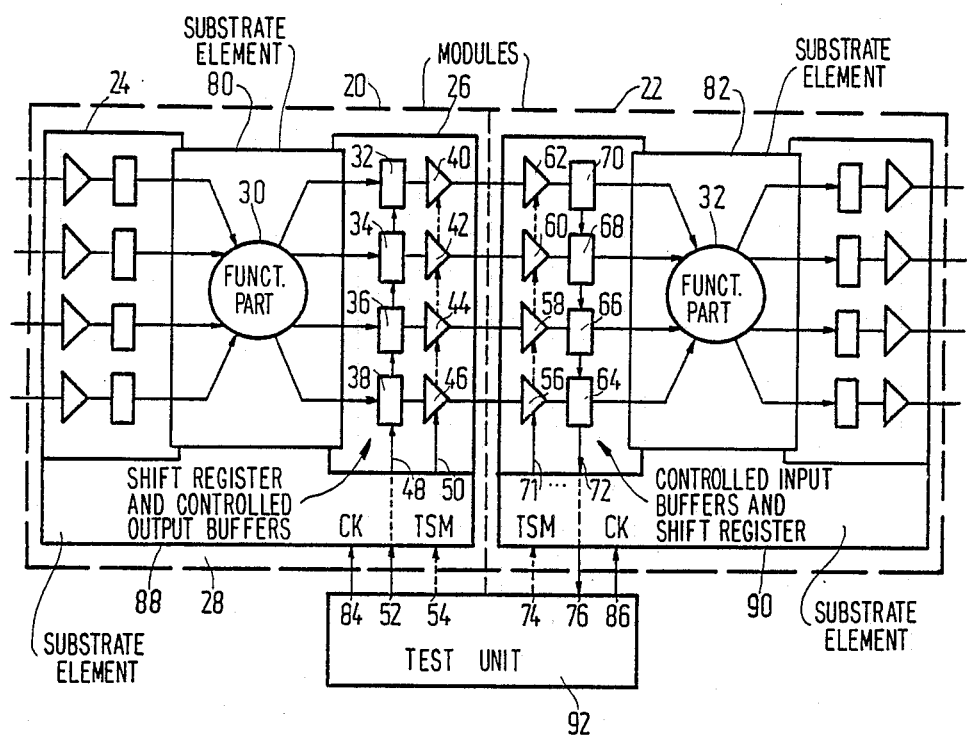
FIG. 1
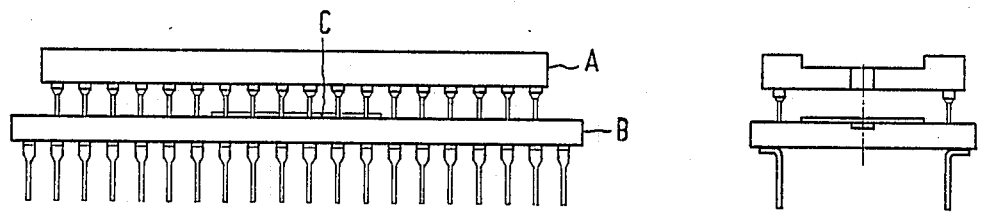
FIG. 2a
FIG. 2b

ELECTRONIC MODULE COMPRISING A FIRST SUBSTRATE ELEMENT WITH A FUNCTIONAL PART, AND A SECOND SUBSTRATE ELEMENT FOR TESTING AN INTERCONNECTION FUNCTION, SOCKET, SUBSTRATE ELEMENT AND ELECTRONIC APPARATUS THEREFOR

BACKGROUND OF THE INVENTION

The invention relates to an electronic module, comprising a first digital integrated circuit and test means for testing an interconnection function between the first integrated circuit and a second integrated circuit which can be connected to the first integrated circuit by way of said interconnection function, which test means comprise a shift register with a series connection for communication with a test unit, a first parallel connection to the interconnection function, and a second parallel connection to a functional part of the first integrated circuit, there being provided a test selection mechanism for activating the series connection and the first parallel connection in a test state and for activating the first and the second parallel connection in an operating state, so that the shift register is transparent in the parallel direction. The testing of digital integrated circuits in accordance with the scan test or LSSD principle is generally known: the circuit comprises flip-flops which are connected in series in a test mode and filled with a test pattern. Subsequently, the circuit is set to an operating state so that the contents of the flip-flops are modified. Finally, the flip-flops are connected in series again and a result pattern is output. Evaluation is performed on the basis of a comparison of the test pattern and the result pattern.

SELECTED STATE OF THE ART

The so-called boundary scan technique for testing an interconnection function between a plurality of electronic modules. Test pattern and result pattern may then be realized in different electronic modules. In the operating state notably data transfer is realized between the various modules. This method, and also the appropriate electronic modules, are known from the previous Netherlands Patent Application No. 8502476, (corresponding to U.S. Pat. No. 4,791,358 issued Dec. 13, 1988) in the name of Applicant incorporated herein by way of reference. The boundary scan technique, however, is not restricted to the testing of the interconnection function: using substantially the same facilities the internal operation of said functional part can also be tested, either separately or together with the interconnection function. The testing of the interconnection however, is possible only if both interconnected electronic modules are suitably equipped for the test. For the testing of the internal operation of the functional part standardization could also be achieved if as many types of integrated circuit as possible were provided with the boundary scan facilities. Many commercially available modules, however, lack the necessary facilities.

SUMMARY OF THE INVENTION

Among other things it is an object of the invention to provide an electronic module which includes the necessary elements, even when the manufacture of the functional substrate element, i.e. the actual chip, has last provided these elements, the resultant module having low manufacturing costs and having the standard dimensions of electronic modules.

To achieve this in accordance with a first aspect of the invention said functional part is provided on a first substrate element, said shift register and test selection mechanism being accommodated on a second substrate element, said first and said second substrate element being physically fixed relative to one another, by means of a fixing mechanism within said electronic module which has the standard dimensions of electronic modules. The two substrate elements can be fixed with respect to one another in various ways. Because the overall electronic module has standard dimensions, it can be readily fitted on a printed circuit board. Printed circuitry is to be understood to mean circuitry permanently provided on or connected to the board, for example by way of conductor tracks or the so-called wirewrap techniques; the technology of the board and the fixing mechanism may also be different. The shape of the module may also differ, for example DIL with two rows of pins, with more rows of pins, with a matrix of pins, a surface mounted device (SMD) or otherwise without projecting pins, and so on.

FURTHER ASPECTS OF THE INVENTION

Preferably, said first substrate element is accommodated in a separate electronic sub-module for which a further electronic sub-module, accommodating said second substrate element, acts as a socket which itself comprises connection means for connection to a printed circuit board. This so-called piggy-back technology is well known, for example for providing a microprocessor with an external memory. This known technology, however, does not cover test environments and merely serves to facilitate the detachment of the piggy-back part. For example, a PROM memory can thus be externally programmed after which it is connected. In accordance with the invention, the actual function is provided on the test socket in a piggy-back configuration. When the piggy-back interconnection operates correctly, the further interconnection function between the modules can thus be simply tested As has already been described in the reference, the interconnection function itself may also comprise further digital circuits, such a buffers, inverters and elementary components.

The invention also relates to a socket for use in conjunction with an electronic sub-module as described above. Notably when data connections are more or less standardized, such a socket can be attractively used for various situations.

On the other hand preferably said first and second substrate elements are interconnected within a package by way of signal connections, the second substrate element being connected, by way of further signal connections, to connection means which are permanently provided in the package and which can be externally connected to a printed circuit board. This results in a simple electronic module in accordance with a so-called hybrid technique. This may also be attractive when the need for testing the interconnection function is relevant for only some of the applications of the functional part. Again it concerns the testing of the interconnection between the electronic module itself on the one side and further modules on the other side. The boundary scan technology per se can also be used for other test purposes, as will be explained hereinafter.

The invention also relates to a substrate element for use in the latter embodiment, and to an electronic apparatus comprising a printed circuit board and at least two electronic modules in accordance with the foregoing which are connected by way of an interconnection. Further attractive aspects are disclosed in the following description of an application of the invention, of preferred realizations thereof and of an architecture relating thereto.

BRIEF DESCRIPTION OF THE FIGURES

The invention will be described in detail hereinafter with reference to some Figures.

FIG. 1 shows two electronic modules in accordance with the invention and an interconnection function therebetween;

FIG. 2a and 2b respectively show side and end elevational views of a first physical realization of an electronic module in accordance with the invention;

DESCRIPTION OF AN APPLICATION OF THE INVENTION

Figure 3:
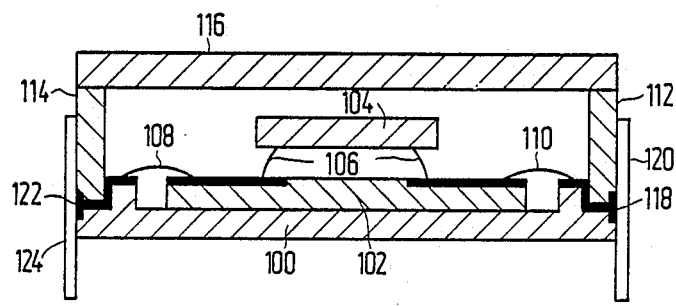
FIG. 3 shows a cross-sectional view of a second physical realization of an electronic module in accordance with the invention.

FIG. 1 shows two electronic modules in accordance with the invention, together with an interconnection function. The electronic modules 20, 22 are denoted by a broken line. Each module comprises a functional part 30, 78 which is accommodated on a first substrate element 80, 82, respectively. This functional part may be of an arbitrary nature, for example it may be a processor, a controller, a memory, etc. The technology of both modules need not be the same. For the sake of simplicity, the two electronic modules are assumed to be identical. Each electronic module also comprises a second substrate element, 88, 90, respectively. The first and the second substrate element may be of an arbitrary technological realization. It will be apparent that the signal levels, slopes, clock frequencies and the like must be compatible. For the sake of simplicity only the interconnection function between the two electronic modules will be discussed. The relevant data path has a width of 4 bits, the module 20 serving exclusively as a source while the module 22 serves exclusively as a destination. In this respect the substrate element 26 then comprises a four-stage shift register with cells 32, 34, 36, 38 and a series input 48. For each cell there is provided a controlled output buffer 40, 42, 44, 46, with an activation input 50. There is also provided a test unit 92. This test unit supplies the electronic module with three signals:
a serial test pattern on line 52,
a test control signal on line 54 which makes a selection between the test state and the operating state,
a test clock signal on line 84 which synchronizes the shifting in the shift register.
The signals on the lines 84, 54 have no effect in the operating state. The control signals for the shift register stages can be developed in various, customary manners. This will not be described for the sake of simplicity. From said control signals there can also be derived a control signal for the buffer stages 40, 42, 44, 46; during writing they are, for example continuously inhibited. This will not be elaborated either.

The construction of the substrate element 90 is similar to that of the substrate element 88; in any case, the data paths should comprise a suitable connection. The element 90 comprises a shift register having cells 64, 66, 68, 70 with a serial output for a result pattern 72. There are again provided controlled buffer stages 56, 58, 60, 62 which are blocked during serial operations of the shift register by a signal on line 71. The test unit supplies two signals: TCK which is the clock on line 86, and the test/operating state control signal TMS on line 74. Furthermore, a result signal TDO is received serially on line 76. When an electronic module is intended to operate as a source device as well as a destination device, usually four additional connections are required for testing the interconnection function. The shift registers comprise each time two parallel connections and one series connection. In the operating state, for example they are transparent in the parallel direction. On the other hand, they may then also have, for example a latch function, but that will be ignored. The interconnection function itself may also be bidirectional. For a complete test, each shift register should then be capable of acting as a source as well as a destination. Therefore, in that case (at least) four additional connections are required for the relevant substrate element. The evaluation of the test results will not be elaborated herein. The three blocks 20, 22, 24 can be accommodated together on a printed circuit board.

It will be apparent that the situation may also be more complex. A module may be interconnected to a plurality of other modules, via data paths of different widths. There may be modules which have been provided with a boundary scan mechanism already on the chip, interconnected to modules in accordance with the invention. It may be that the test facility is not used for given interconnections. Furthermore, there may also be provided interconnections for analog signals which are not suitable for the described test. In practice such analog signals are usually converted into digital signals on the chip, after which they are processed and subsequently converted into analog signals again. Alternatively, only one of these two conversions may be present on the chip. In that case the test register is situated between the digital part of the circuit and the converter to or from the analog signal. Furthermore, in FIG. 1 the buffers can convert the signal, for example between electrical (in the shift register cells) and optical (on the interconnection). Finally, the supply connections have been ignored. It will be apparent that the significance of the digital data signals is arbitrary: data, control, and possibly other signals.

DESCRIPTION OF TWO PREFERRED REALIZATIONS

FIG. 2 shows a first physical realization of an electronic module in accordance with the invention. The physical dimensions are derived from the book Microcontrollers and Peripherals, Book IC 14, 1987, page 1274, published by Philips of Eindhoven, the Netherlands.

In this case the functional part is situated in part A, the other parts being situated in part B, the packaging being realized in known manner. Part B comprises 40 pins. These pins can be soldered into rows of holes customarily provided in printed circuit boards. Part A can be inserted into part B by means of 36 pins, for which purpose part B is provided with a corresponding socket connector. As is shown, part B is provided with an integrated circuit in the Figure: the substrate element with casing underneath the lid C. The part A can be provided with a separate integrated circuit which is then soldered to the ends of the pins. Another possibility is to provide the part A with a permanently embedded substrate element in the same way as the part B. The number of pins of the part A may be less than the number shown, for example because the part B comprises a number of redundant shift register positions or other facilities, or because of standardization aspects. The principal rule is: when the part A comprises n connections, this number amounts to $2n+4$ for the part B; however, the part B may comprise more connections. FIG. 2b is an end view of the electronic module in accordance with the invention. Evidently, many other realizations are feasible without departing from the scope of the invention.

FIG. 3 shows a second physical realization of an electronic module in accordance with the invention. The Figure is derived from European Patent Application No. 174,224, priority JP 27.07.84 (156618) and 16.11.84 (241977), U.S. Pat. No. 4,703,483. The known construction involves testing of the interconnection between the two substrate elements. In accordance with the present invention, notably the interconnection function to the environment is tested. In accordance with the invention, the functional part is situated in the first substrate element 104. This element is connected, by way of first bond pads 106, to the second substrate element 102, for example by thermal compression so that solder bumps provided at suitable areas are fused. The position of the two substrate elements with respect to one another is thus fixed. Alternatively the two substrate elements may be adjacently arranged and both be fixed on a common supporting layer, such as the layer 100 in this case. They can then be interconnected by bond wires. The conductor tracks on the substrate element 102 are denoted by heavy lines. Using bond wires 108, 110 the tracks are connected to conductive elements of the package At their outer ends these elements are provided with thickened portions 118, 122 which are secured to connection pins 120, 124. The bottom 100, the walls 112, 114 and the top 116 form a hermetically sealed package. The hybrid package can be mounted, in the same way as described with reference to FIG. 2, on a carrier 96 with printed circuitry. The above statement as regards the connection may again hold good: the second substrate element comprises four connections for testing which need not be present on the first substrate element. An extension consists in that bond pads on the first substrate element which functionally need not be externally available can still be subjected to a test. The following is an example in this respect: two bond pads carry the same signal, but as a result of the double facility the delay time on the first substrate element may be shorter because the geometrical distance between the bond pad and the destination, or between the location of the source and the bond pad, is shorter in the set-up shown in FIG. 1, the shift register comprises one stage per bond pad; the associated buffers can then be connected together to a single connection pin of the package. The same principle can also be used for other reasons. It is alternatively possible for a given bond pad to carry a signal which is relevant within the circuit, but which is not at all output to the environment. In that case the associated buffer can even be dispensed with in FIG 1. Thus, the number of connections between the first and the second substrate element is larger than the corresponding number of connections between the second substrate element and the environment (notably clock and control connections have not been taken into account).

DETAILED DESCRIPTION OF AN ARCHITECTURE

Figure 4:
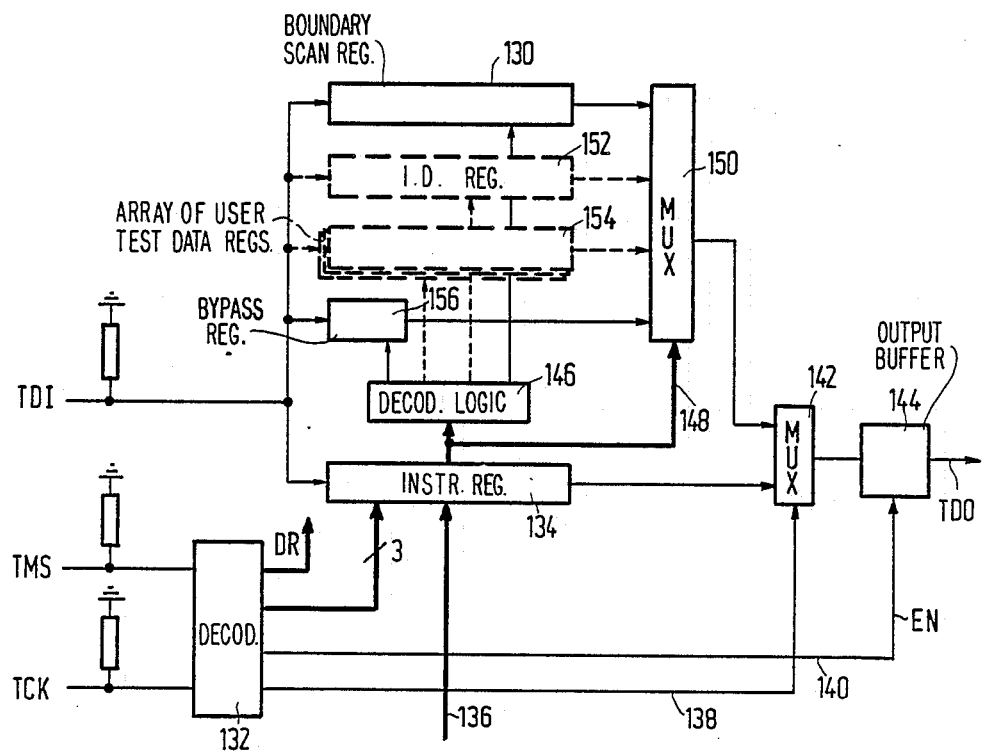
FIG. 4 shows a schematic representation of a more extensive version of the boundary-scan architecture.

FIG. 4 shows a more elaborate version of a boundary scan architecture as may be realized in the second substrate element. Supply connections are ignored. The serial test data appears on input TDI; a terminating resistor is indicated. The test clock signals then appear on input TCK. A selection code appears on input TMS; again a terminating resistor is provided. Element 132 is a decoder which converts the serial code received into a control signal or into an activation signal for outgoing clock signals. Under the control of a first clock signal the instruction register 134 is loaded with the serial data on the input TDI, clocked by an IR clock. Under the control of a second control signal, the "new" contents of the register 134 are activated in order to control further elements of the circuit. Under the control of a third control signal, the register 134 is loaded with parallel status data on line 136. Further control signals provide (line 138) a selection signal for output multiplexer 142 and an enable signal for output buffer 144. The instruction register 134 is connected to decoding logic and, via line 148, to multiplexer 150. The decoding logic 146 applies activation signals to the boundary scan register 130, an identification register 152, an array of user test data registers 154, and a bypass register 156. The register 130 represents the set of series/parallel shift registers of one electronic module, so that it can be connected to the functional part in the first substrate element as well as to the printed circuit board. These connections have been omitted for the sake of simplicity. The registers 130, 152, 154, 156 receive clock signals and selection/control signals from the block 32 (DR clock signals). The architecture of FIG. 4 is described per se in Final Version 2.0 of the standard boundary scan architecture, CFT, Philips Eindhoven, Apr. 1988; the division into first and second substrate elements is not mentioned therein.

We claim:

1. An electronic module, comprising a first digital integrated circuit and test means for separately testing an interconnection function between the first integrated circuit and a second integrated circuit not within said module which can be connected to the first integrated circuit by way of said interconnection function, which test means comprise a shift register with a series connection for communication with a test unit, a first parallel connection to the interconnection function, and second parallel connection to a functional part of the first integrated circuit, there being provided a test selection mechanism for activating the series connection and the first parallel connection in a test state and for activating the first parallel connection in a test state and for activating the first and second parallel connections in an operating state, so that the shift register is transparent in the parallel direction, characterized in that said functional part is provided on a first substrate element, said shift register and test selection mechanism being accommodated on a second substrate element, and said first and said second substrate element being physically fixed relative to one another by means of a fixing mechanism within said electronic module which has the standard dimensions of electronic modules.

2. An electronic module as claimed in claim 1, wherein said interconnection function includes a printed circuit board and wherein said first substrate element is included in a first electronic sub-module for which a second electronic sub-module comprising said second substrate acts as a socket and which second sub-module comprises connection means for connection to said printed circuit board.

3. An electronic module as claimed in claim 2, characterized in that said first electronic sub-module is constructed so as to include connector pins for which said socket comprises connection socket means.

4. An electronic module as claimed in claim 1, characterized in that said first and said second substrate element are connected to one another by way of signal connections within a package, the second substrate element being connected, via further signal connections, to connection means which are fixed in the package and which can be externally connected to a printed circuit board.

5. An electronic module as claimed in claim 4, characterized in that the number of connections between the first and the second substrate element is larger than the number of corresponding connections between the second substrate element and the environment.

6. Test means for separately testing an interconnection function between a pair of standard integrated circuits, at least one of which comprises a first substrate element included in a first electronic sub-module, which standard integrated circuits can be connected to each other by way of said interconnection function including a printed circuit board, which test means comprises a test integrated circuit having a shift register with a series connection for communication with a test unit, a first parallel connection for connection to the interconnection function, and a second parallel connection for connection to said first electronic sub-module, there being provided a test selection mechanism for activating the series connection and the first parallel connection in a test state and for activating the first and second parallel connections in an operating state, so that the shift register is transparent in the parallel direction, said test integrated circuit being accommodated on a second substrate element, included in a second electronic sub-module including connection means to said printed circuit board, said connection means being, at least in part, bidirectionally active, said second electronic module acting as a socket for receiving said first electronic sub-module.

7. A test means as claimed in claim 6, characterized in that it comprises a serial input for test patterns, a serial output for result patterns, a test clock input, a test control input, and at least two optionally activatable data paths between said serial input and said serial output.

8. A test substrate element on which is formed a test integrated circuit having shift register and test selection mechanism for interconnection with a separate first standard substrate element having first integrated circuit formed thereon, said test integrated circuit comprising means for separately testing an interconnection function between the functional parts of the first integrated circuit and a separate second integrated circuit which can be connected to the first integrated circuit by way of said interconection function, which test means comprise the shift register with a series connection for communication with a test unit, a first parallel connection for connection to the interconnection function, and a second parallel connection for connection to the functional part of the first integrated circuit, the test selection mechanism being for activating the series connection and the first parallel connection in a test state and for activating the first and second parallel connections in an operating state, so that the shift register is transparent in the parallel direction.

9. A substrate element as claimed in claim 8, characterized in that it comprises a serial input for test patterns, a serial output for result patterns, a test clock input, a test control input, and at least two optionally activatable data paths between said serial input and said serial output.

10. An electronic apparatus for digital signal processing comprising:
a printed circuit board, at least two electronic modules separately operatively installed on said circuit board, each module having a standard integrated circuit with a functional part, the standard integrated circuits of said modules being characterized by an interconnection function if the functional parts of the standard integrated circuits were directly interconnected, means on said circuit board interconnecting said modules, wherein each module comprises test means for separately testing the interconnection function between the standard integrated circuits and which test means comprise a shift register with a series connection for communication with a test unit, a first parallel connection to the interconnection function, and a second parallel connection to the standard integrated circuit of said module, there being provided a test selection mechanism for activating the series connection and the first parallel connection in a test state and for activating the first and second parallel connections in an operating state, so that the shift register is transparent in the parallel direction, characterized in that in at least one of said modules said functional part is provided on a first substrate element, said shift register and test selection mechanism being accommodated on a second substrate element, said first and said second substrate element being physically fixed relative to one another by means of a fixing mechanism within said electronic module, said module having the standard dimensions of electronic modules.

* * * * *